United States Patent
Sato et al.

(10) Patent No.: US 10,032,642 B2
(45) Date of Patent: Jul. 24, 2018

(54) SUBSTRATE LIQUID PROCESSING APPARATUS

(71) Applicant: Tokyo Electron Limited, Tokyo (JP)

(72) Inventors: Hideaki Sato, Kumamoto (JP); Takashi Nagai, Kumamoto (JP); Hiromi Hara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/152,918

(22) Filed: May 12, 2016

(65) Prior Publication Data

US 2016/0336202 A1 Nov. 17, 2016

(30) Foreign Application Priority Data

May 14, 2015 (JP) ................................ 2015-098832

(51) Int. Cl.
*H01L 21/67* (2006.01)
*H01L 21/311* (2006.01)
(Continued)

(52) U.S. Cl.
CPC .. *H01L 21/31111* (2013.01); *H01L 21/67086* (2013.01); *H01L 21/67253* (2013.01);
(Continued)

(58) Field of Classification Search
USPC ............ 156/345.11, 345.12, 345.13, 345.15, 156/345.24
See application file for complete search history.

(56) References Cited

U.S. PATENT DOCUMENTS

2003/0203624 A1* 10/2003 Sameshima .............. C09G 1/04
438/687
2008/0035609 A1* 2/2008 Kashkoush ....... H01L 21/31111
216/84
(Continued)

FOREIGN PATENT DOCUMENTS

| JP | 2000-077381 A | 3/2000 |
|---|---|---|
| JP | 2013-093478 A | 5/2013 |
| JP | 2015070080 A * | 4/2015 |

OTHER PUBLICATIONS

Machine Generated English Translation of JP2015070080. Published Apr. 13, 2015.*

*Primary Examiner* — Sylvia MacArthur
(74) *Attorney, Agent, or Firm* — Abelman, Frayne & Schwab

(57) ABSTRACT

Disclosed is a substrate liquid processing apparatus that includes: a liquid processing unit that performs a liquid processing on a film formed on a surface of a substrate with an etching liquid; an etching liquid supply unit that supplies an etching liquid to the liquid processing unit; and a controller that controls the etching liquid supply unit. The controller is configured to perform a control such that an etching liquid in a state of having a relatively low etching rate for the film is supplied from the etching liquid supply unit to the liquid processing unit so that the substrate is etched in the liquid processing unit, and then, an etching liquid in a state of having a relatively high etching rate for the film is supplied from the etching liquid supply unit to the liquid processing unit so that the substrate is etched in the liquid processing unit.

6 Claims, 5 Drawing Sheets

(51) Int. Cl.
   *G02F 1/1333*    (2006.01)
   *B24B 37/005*    (2012.01)
   *H01L 21/66*     (2006.01)

(52) U.S. Cl.
   CPC ......... *B24B 37/005* (2013.01); *H01L 21/6704* (2013.01); *H01L 21/67017* (2013.01); *H01L 21/67023* (2013.01); *H01L 21/67075* (2013.01); *H01L 21/67242* (2013.01); *H01L 22/26* (2013.01)

(56) References Cited

U.S. PATENT DOCUMENTS

| | | | | |
|---|---|---|---|---|
| 2008/0087645 A1* | 4/2008 | Izuta | ................. | C09K 13/04 216/93 |
| 2008/0096393 A1* | 4/2008 | Kim | ................. | H01L 21/31111 438/745 |
| 2008/0210900 A1* | 9/2008 | Wojtczak | ......... | H01L 21/31111 252/79.3 |
| 2008/0274670 A1* | 11/2008 | Tada | ................. | B24B 9/065 451/6 |
| 2009/0036024 A1* | 2/2009 | Matsuzaki | ........... | B24B 37/013 451/5 |
| 2009/0081881 A1* | 3/2009 | Kiyose | ............. | H01L 21/67086 438/753 |
| 2009/0087645 A1* | 4/2009 | Mizuhara | ............... | C30B 23/00 428/332 |
| 2010/0093259 A1* | 4/2010 | Lee | ......................... | B24B 49/12 451/5 |
| 2011/0130073 A1* | 6/2011 | Furukawa | ............. | B24B 37/042 451/6 |
| 2012/0145672 A1* | 6/2012 | Ratkovich | ......... | H01L 21/31111 216/83 |
| 2015/0099314 A1* | 4/2015 | Saraf | ................ | H01J 37/00 438/9 |
| 2015/0162224 A1* | 6/2015 | Hinode | .............. | H01L 29/6653 438/751 |
| 2015/0262737 A1* | 9/2015 | Hinode | .............. | H01L 21/67017 216/83 |
| 2016/0336202 A1* | 11/2016 | Sato | ................. | H01L 21/31111 |

* cited by examiner

SUBSTRATE LIQUID PROCESSING APPARATUS

CROSS-REFERENCE TO RELATED APPLICATIONS

This application is based on and claims priority from Japanese Patent Application No. 2015-098832, filed on May 14, 2015, with the Japan Patent Office, the disclosure of which is incorporated herein in its entirety by reference.

TECHNICAL FIELD

The present disclosure relates to a substrate liquid processing apparatus, a substrate liquid processing method, and a computer-readable storage medium that stores a substrate liquid processing program, in which a film formed on a surface of a substrate is subjected to a liquid processing with an etching liquid.

BACKGROUND

In manufacturing, for example, a semiconductor component or a flat panel display, a substrate liquid processing apparatus that performs a liquid processing on a film formed on a surface of a substrate (e.g., a semiconductor wafer or a liquid crystal substrate) with an etching liquid (processing liquid) is used in order to form, for example, a circuit pattern on the surface of the substrate.

For example, the substrate liquid processing apparatus, which is disclosed in Japanese Patent Laid-Open Publication No. 2013-93478, boils a phosphoric acid aqueous solution (etching liquid) at a predetermined temperature so as to prepare phosphoric acid aqueous solution at a predetermined concentration, and immerses a substrate in the phosphoric acid aqueous solution for a predetermined time so as to etch a film formed on the surface of the substrate. On the surface of the substrate, a silicon oxide film is formed as an underlayer, and a silicon nitride film is formed on the surface of the silicon oxide film. Meanwhile, when performing the etching, a desired resist pattern is formed on the surface of the silicon nitride film.

SUMMARY

In the present disclosure, a substrate liquid processing apparatus includes: a liquid processing unit configured to perform a liquid processing on a film formed on a surface of a substrate with an etching liquid; an etching liquid supply unit configured to supply the etching liquid to the liquid processing unit; and a controller configured to control the etching liquid supply unit. The controller is configured to perform a control such that an etching liquid in a state of having a relatively low etching rate for the film is supplied from the etching liquid supply unit to the liquid processing unit so that the substrate is etched in the liquid processing unit, and then, an etching liquid in a state of having a relatively high etching rate for the film is supplied from the etching liquid supply unit to the liquid processing unit so that the substrate is etched in the liquid processing unit.

The foregoing summary is illustrative only and is not intended to be in any way limiting. In addition to the illustrative aspects, embodiments, and the features described above, further aspects, embodiments, and features will become apparent by reference to the drawings and the following detailed description.

DETAILED DESCRIPTION

Figure 1:
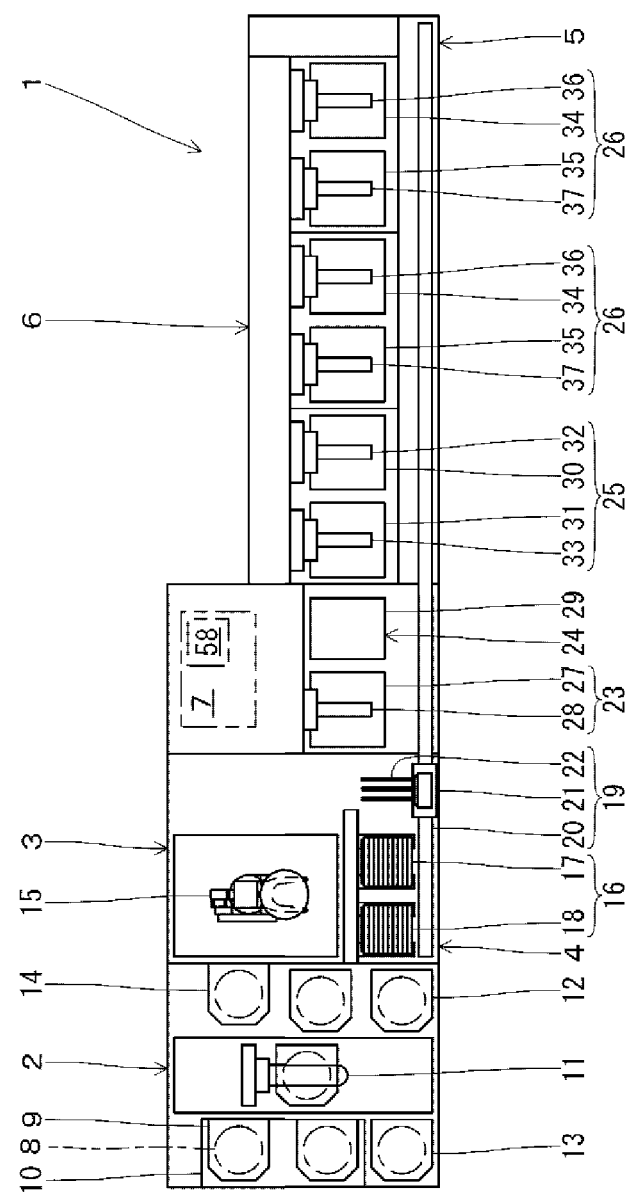
FIG. 1 is a plan explanatory view illustrating a substrate liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the substrate liquid processing apparatus, a substrate is immersed in a predetermined concentration (a predetermined temperature) of a phosphoric acid aqueous solution for a predetermined time so as to etch a silicon nitride film formed on the surface of the substrate along a resist pattern. In the etching, it is desired that only the silicon nitride film is etched.

In the conventional substrate liquid processing apparatus, however, a portion of the silicon oxide film of the underlayer is also etched due to the action of the phosphoric acid aqueous solution, in addition to the silicon nitride film. Further, there is a concern that the thickness of the silicon oxide film of the underlayer may be thinned to disrupt, for example, the subsequent formation of a circuit pattern, thereby causing a decrease in yield.

In the present disclosure, a substrate liquid processing apparatus includes: a liquid processing unit configured to perform a liquid processing on a film formed on a surface of a substrate with an etching liquid; an etching liquid supply unit configured to supply the etching liquid to the liquid processing unit; and a controller configured to control the etching liquid supply unit. The controller is configured to perform a control such that an etching liquid in a state of having a relatively low etching rate for the film is supplied from the etching liquid supply unit to the liquid processing unit so that the substrate is etched in the liquid processing unit, and then, an etching liquid in a state of having a relatively high etching rate for the film is supplied from the etching liquid supply unit to the liquid processing unit so that the substrate is etched in the liquid processing unit.

In addition, the controller is configured to perform a control so as to change a state of the etching rate for the film by changing a temperature or a concentration of the etching liquid supplied from the etching liquid supply unit to the liquid processing unit.

In addition, the controller is configured to: set a time and an etching amount for etching the substrate with an etching liquid in a predetermined state of a standard etching rate for the film as a standard etching time and a standard etching amount; set a time and an etching amount for etching the substrate in the liquid processing unit by supplying, from the etching liquid supply unit to the liquid processing unit, an etching liquid in a state of having an etching rate lower than that of the etching liquid in the standard state, as a first processing time and a first etching amount; set a time and an etching amount for etching the substrate in the liquid processing unit by supplying, from the etching liquid supply unit to the liquid processing unit, an etching liquid in a state of having an etching rate higher than that of the etching liquid in the standard state, as a second processing time and a second etching amount; and perform a control such that a sum of the first processing time and the second processing time becomes the standard processing time, and a sum of the first etching amount and the second etching amount becomes the standard etching amount.

In addition, the film is a silicon nitride film formed on the surface of the silicon oxide film, and the etching liquid is a phosphoric acid aqueous solution.

In addition, the film is a silicon nitride film formed on the surface of the silicon oxide film, the etching liquid is a phosphoric acid aqueous solution, and the controller is configured to perform the control such that the etching is performed with the phosphoric acid aqueous solution in the state of having a relatively low etching rate until the silicon concentration in the phosphoric acid aqueous solution becomes a concentration at which the amount of the silicon oxide film etched by the phosphoric acid aqueous solution is suppressed, and then the etching is performed with the phosphoric acid aqueous solution in the state of having a relatively high etching rate.

In addition, the present disclosure provides a substrate liquid processing method that includes: performing an etching with an etching liquid in a state of having a relatively low etching rate for the film formed on a surface of a substrate; and then, performing an etching with an etching liquid in a state of having a relatively high etching rate for the film formed on the surface of the substrate.

The state of the etching rate for the film is changed by changing a temperature or a concentration of the etching liquid.

In addition, a time and an etching amount for etching the substrate with an etching liquid in state of having a predetermined etching rate for the film are set as a standard etching time and a standard etching amount; a time and an etching amount for etching the substrate in the liquid processing unit by supplying, from the etching liquid supply unit to the liquid processing unit, an etching liquid in a state of having an etching rate lower than that of the etching liquid in the standard state, are set as a first processing time and a first etching amount; a time and an etching amount for etching the substrate in the liquid processing unit by supplying, from the etching liquid supply unit to the liquid processing unit, an etching liquid in a state of having an etching rate higher than that of the etching liquid in the standard state, are set as a second processing time and a second etching amount; and the substrate is etched such that a sum of the first processing time and the second processing time becomes the standard processing time, and a sum of the first etching amount and the second etching amount becomes the standard etching amount.

In addition, the film is a silicon nitride film formed on the surface of the silicon oxide film, and the etching liquid is a phosphoric acid aqueous solution.

In addition, the film is a silicon nitride film formed on the surface of the silicon oxide film, the etching liquid is a phosphoric acid aqueous solution, and the etching is performed with the phosphoric acid aqueous solution in the state of having a relatively low etching rate is low until the silicon concentration in the phosphoric acid aqueous solution becomes a concentration at which the amount of the silicon oxide film etched by the phosphoric acid aqueous solution is suppressed, and then the etching is performed with the phosphoric acid aqueous solution in the state having a relatively high etching rate.

In addition, the present disclosure provides a non-transitory computer-readable storage medium storing a substrate liquid processing program that, when executed, causes a computer to execute a substrate liquid processing method by using a substrate liquid processing apparatus including a liquid processing unit configured to perform a liquid processing on a film formed on a surface of a substrate with an etching liquid and an etching liquid supply unit configured to supply an etching liquid to the liquid processing unit. An etching liquid in a state of having a relatively low etching rate for the film is supplied from the etching liquid supply unit to the liquid processing unit so as to etch the substrate in the liquid processing unit, and then an etching liquid in a state of having a relatively high etching rate for the film is supplied from the etching liquid supply unit to the liquid processing unit so as to etch the substrate in the liquid processing unit.

In the present disclosure, it is possible to properly etch a film formed on a surface of a substrate.

Hereinafter, specific configurations of a substrate liquid processing apparatus, a substrate liquid processing method, and a substrate liquid processing program according to the present disclosure will be described with reference to the accompanying drawings.

As illustrated in FIG. 1, a substrate liquid processing apparatus 1 includes a carrier carry-in/out unit 2, a lot forming unit 3, a lot mounting unit 4, a lot conveyance unit 5, a lot processing unit 6, and a controller 7.

The carrier carry-in/out unit 2 performs the carry-in/out of a carrier 9 that accommodates a plurality of (e.g., twenty five (25)) substrates (e.g., silicon wafers) 8 which are arranged side by side in the vertical direction in a horizontal posture.

The carrier carry-in/out unit 2 is provided with a carrier stage 10 configured to mount a plurality of carriers 9 thereon, a carrier conveyance mechanism 11 configured to perform the conveyance of a carrier 9, carrier stocks 12 and 13 each configured to temporarily store a carrier 9 therein, and a carrier mounting table 14 configured to mount a carrier 9 thereon. Here, the carrier stock 12 temporarily stocks the substrates 8 to be turned into products, before processing the substrates 8 in the lot processing unit 6. In addition, the carrier stock 13 temporarily stocks the substrates 8 to be turned into products, after processing the substrates 8 in the lot processing unit 6.

In addition, the carrier carry-in/out unit 2 conveys the carrier 9, which is carried into the carrier stage 10 from the outside, to the carrier stock 12 or the carrier mounting table 14 by using the carrier conveyance mechanism 11. In addition, the carrier carry-in/out unit 2 conveys the carrier 9, which is mounted on the carrier mounting table 14, to the carrier stock 13 or the carrier stage 10 by using the carrier conveyance mechanism 11. The carrier 9, which is conveyed to the carrier stage 10, is conveyed to the outside.

The lot forming unit 3 forms a lot that includes a plurality of (e.g., fifty (50)) substrates 8 to be simultaneously processed by combining the substrates 8 accommodated in one or more carriers 9.

The lot forming unit 3 is provided with a substrate conveyance mechanism 15 configured to convey a plurality of substrates. Meanwhile, during the conveyance of the substrates 8, the substrate conveyance mechanism 15 may change the posture of the substrates 8 from the horizontal posture to the vertical posture, or from the vertical posture to the horizontal posture.

In addition, the lot forming unit 3 conveys the substrates 8 from the carrier 9 mounted on the carrier mounting table 14 to the lot mounting unit 4 using the substrate conveyance mechanism 15, and forms a lot in the lot mounting unit 4. In addition, the lot forming unit 3 conveys the lot mounted on the lot mounting unit 4 to the carrier 9 mounted on the carrier mounting table 14, by the substrate conveyance mechanism 15. Meanwhile, the substrate conveyance mechanism 15 includes two kinds of substrate support units so as to support the plurality of substrates 8, i.e., a pre-processing substrate support unit configured to support the substrates 8 before a processing (before being conveyed by the lot conveyance unit 5) and a post-processing substrate support unit configured to support the substrates 8 after a processing (after being conveyed by the lot conveyance unit 5). By this, for example, particles attached to, for example, the pre-processing substrates 8 are suppressed from being transferred to, for example, the post-processing substrates 8.

The lot mounting unit 4 temporarily mounts, on the lot mounting unit 16, the lots conveyed between the lot forming unit 3 and the lot processing unit 6 by the lot conveyance unit 5.

The lot mounting unit 4 is provided with a carry-in side lot mounting table 17 configured to mount thereon a lot before processing (before being conveyed by the lot conveyance unit 5) and a carry-out side lot mounting table 18 configured to mount thereon a lot after processing (after being conveyed by the lot conveyance unit 5). On each of the carry-in side lot mounting table 17 and the carry-out side lot mounting table 18, a plurality of substrates 8 of one lot are mounted side by side in the back-and-forth direction in the vertical posture.

In addition, in the lot mounting unit 4, the lot formed in the lot forming unit 3 is mounted on the carry-in side lot mounting table 17, and carried into the lot processing unit 6 through the lot conveyance unit 5. In addition, in the lot mounting unit 4, the lot carried out from the lot processing unit 6 through the lot conveyance unit 5 is mounted on the carry-out side lot mounting table 18, and conveyed to the lot forming unit 3.

The lot conveyance unit 5 conveys the lot between the lot mounting unit 4 and the lot processing unit 6 or the inside of the lot processing unit 6.

The lot conveyance unit 5 is provided with a lot conveyance mechanism 19 configured to convey a lot. The lot conveyance mechanism 19 is constituted with a rail 20 arranged along the lot mounting unit 4 and the lot processing unit 6, and a mobile body 21 configured to move along the rail 20 while holding a plurality of substrates 8. In the mobile body 21, a substrate holding body 22 configured to hold a plurality of substrates 8, which are arranged side by side in the back-and-forth direction in the vertical posture, is provided to be movable back and forth.

In addition, the lot conveyance unit 5 receives a lot mounted on the carry-in side lot mounting table 17 by the substrate holding body 22 of the lot conveyance mechanism 19, and delivers the lot to the lot processing unit 6. Further, the lot conveyance unit 5 receives a lot processed in the lot processing unit 6 by the substrate holding body 22 of the lot conveyance mechanism 19, and delivers the lot to the lot processing unit 18. In addition, the lot conveyance unit 5 conveys the lot within the lot processing unit by using the lot conveyance mechanism 19.

The lot processing unit 6 performs a processing such as, for example, etching, cleaning, or drying by handling a plurality of substrates 8, which are arranged side by side in the back-and-forth direction in the vertical posture, as one lot.

The lot processing unit 6 is provided with a drying apparatus 23 configured to perform the drying of the substrates 8, a substrate holding body cleaning apparatus 24 configured to perform the cleaning of the substrate holding body 22, a cleaning apparatus 25 configured to perform the cleaning of the substrates 8, and two etching apparatuses 26 configured to perform the etching of the substrates 8. The apparatuses are arranged side by side in the lot processing unit 6.

The drying apparatus 23 includes a substrate lifting mechanism 28 that is installed to be movable up and down in a processing bath 27. The processing bath 27 is supplied with a drying gas (e.g., isopropyl alcohol (IPA)). In the substrate lifting mechanism 28, a plurality of substrates 8 of one lot are held side by side in the back-and-forth direction in the vertical posture. The drying apparatus 23 receives the lot from the substrate holding body 22 by the substrate lifting mechanism 28, and lifts the lot by the substrate lifting mechanism 28 such that the drying of the substrates 8 is performed with a processing gas supplied to the processing bath 27. In addition, the drying apparatus 23 delivers the lot from the substrate lifting mechanism 28 to the substrate holding body 22 of the lot conveyance mechanism 19.

The substrate holding body cleaning apparatus 24 is configured to supply a cleaning liquid and a dry gas to a processing bath 29, and perform the cleaning of the substrate holding body 22 by supplying the cleaning liquid to the substrate holding body 22 of the lot conveyance mechanism 19 and then supplying the dry gas.

The cleaning apparatus 25 includes a cleaning bath 30 and a rinsing bath 31, and the cleaning bath 30 and the rinsing bath 31 are provided with substrate lifting mechanisms 32 and 33, respectively, such that the substrate lifting mechanisms 32 and 33 are movable up and down. A cleaning liquid (e.g., SC-1) is stored in the cleaning bath 30. A rinsing liquid (e.g., pure water) is stored in the rinsing bath 31.

The etching apparatus 26 includes an etching bath 34 and a rinsing bath 35, and the etching bath 34 and the rinsing bath 35 are provided with substrate lifting mechanisms 36 and 37, respectively, such that the substrate lifting mechanisms 36 and 37 are movable up and down. An etching liquid (e.g., a phosphoric acid aqueous solution) is stored in the etching bath 34. A rinsing liquid (e.g., pure water) is stored in the rinsing bath 35.

The cleaning apparatus 25 and the etching apparatus 26 are configured to be similar to each other. Referring to the etching apparatus 26, in each of the substrate lifting mechanisms 36 and 37, a plurality of substrates 8 of one lot are held in the vertical posture to be in parallel with each other in a back-and-forth direction. The etching apparatus 26 receives the lot from the substrate holding body 22 of the lot conveyance mechanism 19 by the substrate lifting mechanism 36, and lifts the lot by the substrate lifting mechanism 36 so as to immerse the lot in the etching liquid in the etching bath 34 such that the etching of the substrates 8 is performed. Then, the etching apparatus 26 delivers the lot from the substrate lifting mechanism 36 to the substrate holding body 22 of the lot conveyance mechanism 19. In addition, the etching apparatus 26 receives the lot from the substrate holding body 22 of the lot conveyance mechanism 19 by the substrate lifting mechanism 37, and lifts the lot by the substrate lifting mechanism 37 so as to immerse the lot in the rinsing liquid in the rinsing bath 35 such that the rinsing of the substrates 8 is performed. Then, the etching apparatus 26 delivers the lot from the substrate lifting mechanism 37 to the substrate holding body 22 of the lot conveyance mechanism 19.

In the etching apparatus 26, a liquid processing (etching) is performed on the substrates 8 using an aqueous solution (phosphoric acid aqueous solution) of a chemical (phosphoric acid) having a predetermined concentration as the processing liquid (etching liquid).

Figure 2:
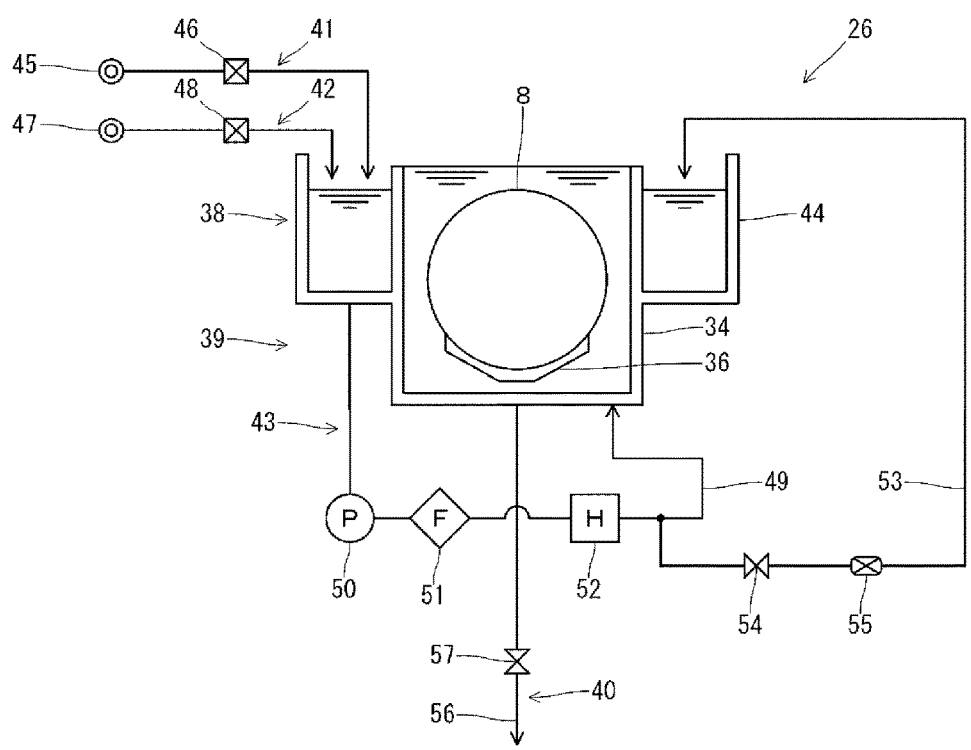
FIG. 2 is an explanatory view illustrating an etching apparatus.

As illustrated in FIG. 2, the etching apparatus 26 includes a liquid processing unit 38 configured to store a processing liquid and perform a liquid processing on the substrates 8, an etching liquid supply unit 39 configured to supply the processing liquid to the liquid processing unit 38, and a processing liquid discharge unit 40 configured to discharge the processing liquid from the liquid processing unit 38. The etching liquid supply unit 39 includes a chemical liquid supply unit 41 configured to supply a new chemical liquid (phosphoric acid aqueous solution) to the liquid processing unit 38, a diluent (pure water) supply unit 42 configured to supply a diluent (pure water) to the liquid processing unit 38, and a processing liquid circulation unit 43 configured to circulate the processing liquid stored in the liquid processing unit.

The liquid processing unit 38 forms a top-opened outer bath 44 around the upper portion of the top-opened etching bath 34 and stores the processing liquid in the etching bath 34 and the outer bath 44. In the etching bath 34, a processing liquid is stored to perform a liquid processing on the substrates by immersing the substrates 8 in the processing liquid by the substrate lifting mechanism 36. The processing liquid overflown from the etching bath 34 is stored in the outer bath 44, and the processing liquid is supplied to the etching bath 34 by the processing liquid circulation unit 43.

The chemical liquid supply unit 41 supplies a processing liquid having a temperature and concentration that are different from those of the processing liquid (lower than those of the processing liquid) to the liquid processing unit 38. The chemical liquid supply unit 41 connects an aqueous solution supply source 45 configured to supply the phosphoric acid aqueous solution to the outer bath 44 of the liquid processing unit 38 through a flow rate regulator 46. The flow rate regulator 46 is connected to a controller 7 to be subjected to an open/close control and a flow rate control by the controller 7.

The diluent supply unit 42 supplies pure water to the liquid processing unit 38 in order to replenish the amount of water vaporized by the heating (boiling) of the processing liquid. The diluent supply unit 42 connects a pure water supply source 47 configured to supply the pure water to the outer bath 44 of the liquid processing unit 38 through a flow rate regulator 48. The flow rate regulator 48 is connected to the controller 7 to be subjected to an open/close control and a flow rate control by the controller 7.

The processing liquid circulation unit 43 forms a circulation flow path 49 between the bottom of the outer bath 44 of the liquid processing unit 38 and the bottom of the etching bath 34. In the circulation flow path 49, a pump 50, a filter 51, and a heater 52 are provided in this order. The pump 50 and the heater 52 are connected to the controller 7 to be subjected to a drive control by the controller 7. In addition, the processing liquid circulation unit 43 drives the pump 50 to circulate the processing liquid from the outer bath 44 to the etching bath 34. At that time, the processing liquid is heated by the heater 52.

In addition, the processing liquid circulation unit 43 forms a concentration measuring flow path 53 between the middle of the circulation flow path 49 (more downstream side than the hater 52) and the outer bath 44. In the concentration measuring flow path 53, an open/close valve 54 and a concentration sensor 55 are provided in this order. The open/close valve 54 is connected to the controller 7 to be subjected to an open/close control by the controller 7. In addition, the concentration sensor 55 is connected to the controller 7, and based on the instruction from the controller 7, the concentration sensor 55 measures the concentration of the processing liquid flowing in the concentration measuring flow path 53, and notifies the controller 7 of the measured concentration.

The processing liquid discharge unit 40 connects a liquid discharge flow path 56, which communicates with an external liquid discharge pipe, to the bottom of the etching bath 34 of the liquid processing unit 38, and the liquid discharge flow path 56 is provided with an open/close valve 57. The open/close valve 57 is connected to the controller 7 to be subjected to an open/close control by the controller 7.

The controller 7 controls respective units of the substrate liquid processing apparatus 1 (e.g., the carrier carry-in/out unit 2, the lot forming unit 3, the lot mounting unit 4, the lot conveyance unit 5, and the lot processing unit 6).

The controller 7 is, for example, a computer, and is provided with a computer-readable storage medium 58. The storage medium 58 is stored with a program that controls various processes executed in the substrate liquid processing apparatus 1. The controller 7 controls the operations of the substrate liquid processing apparatus by reading and executing the program stored in the storage medium. Meanwhile, the program is a program that has been stored in the computer-readable storage medium 58, and may be a program that has been installed to the storage medium 58 of the controller 7 from another storage medium. The computer-readable storage medium 58 may be, for example, a hard disc (HD), a flexible disc (FD), a compact disc (CD), a magnet optical disc (MO), or a memory card.

The substrate liquid processing apparatus 1 is configured as described above, and processes substrates 8 by controlling the operations of respective units (e.g., the carrier carry-in/out unit 2, the lot forming unit 3, the lot forming unit 4, the lot conveyance unit 5, and the lot processing unit 6) by the controller 7 according to, for example, the program stored in the storage medium 58.

Figure 3:
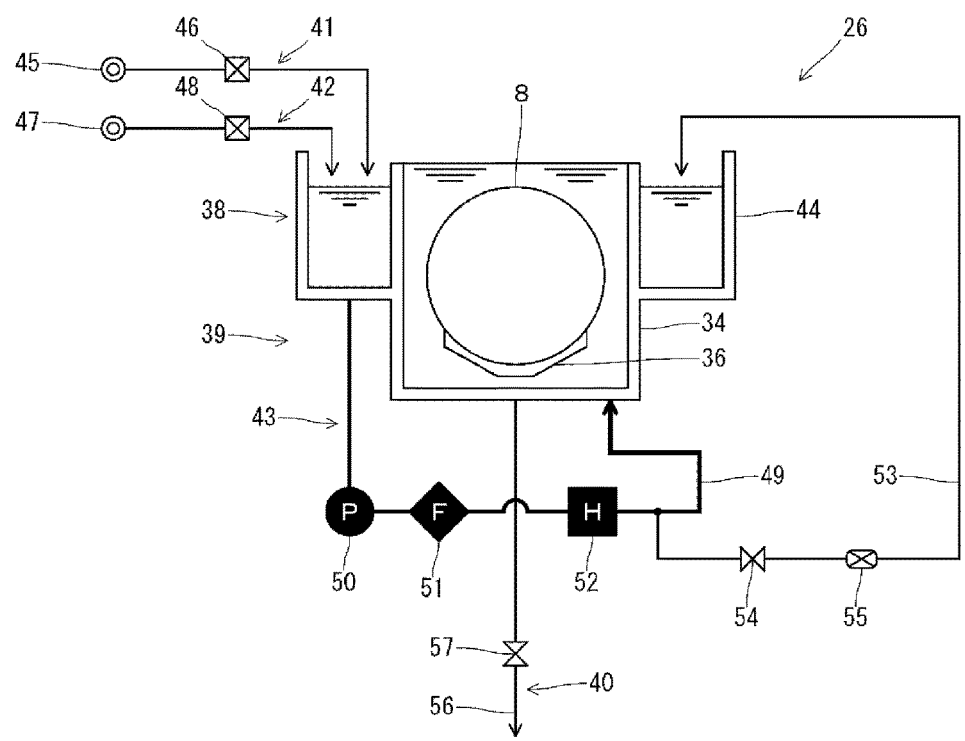
FIG. 3 is an explanatory view illustrating an operation of the etching apparatus during etching.

In the case where the etching is performed on the substrates 8 in the substrate liquid processing apparatus 1, the processing liquid of the liquid processing unit 38 of the etching apparatus 26 is heated to a predetermined temperature to boil the processing liquid such that a processing liquid having a concentration at the boiling point is generated and stored in the etching bath 34. More specifically, as illustrated in FIG. 3, the controller 7 drives the pump 50 so as to circulate the processing liquid in the circulation flow path 49, and drives the heater 52 so as to maintain the processing liquid at a predetermined temperature. At that time, since the water is vaporized by the heating, and thus, the concentration of processing liquid increases, pure water is supplied to the liquid processing unit 38 by the diluent supply unit 42 by an amount that corresponds to the amount of the water vaporized by the heating. In addition, by immersing the substrates 8 in the etching bath 34 that stores the processing liquid having the predetermined concentration and temperature, the etching (liquid processing) is performed on the substrates 8 with the processing liquid.

Figure 4:
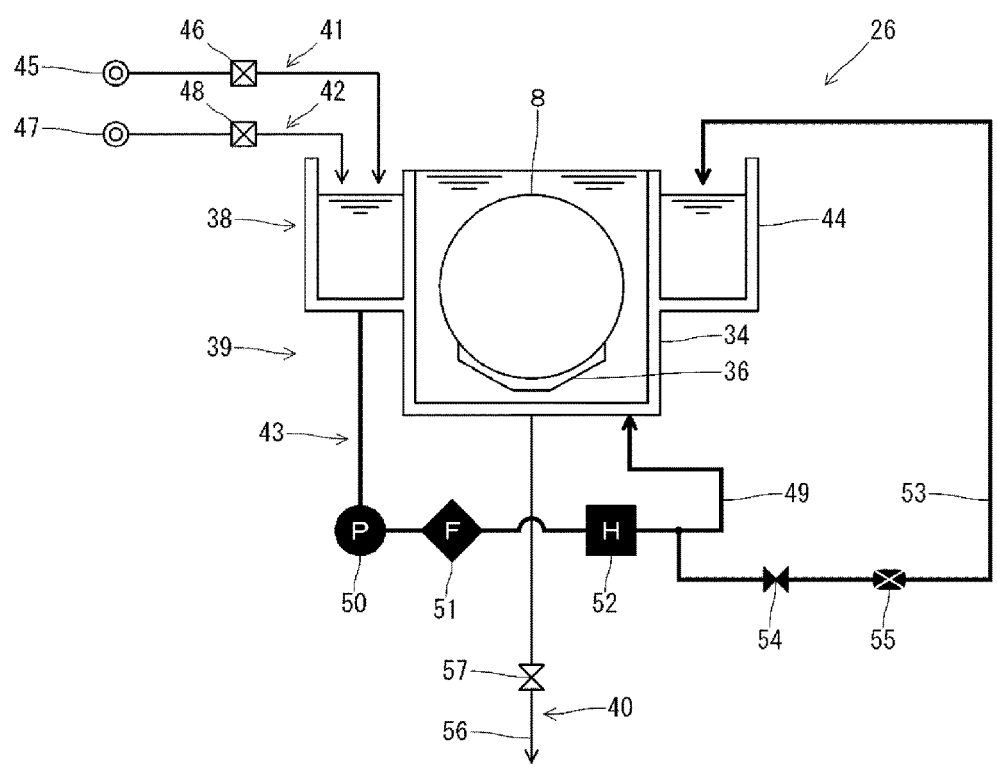
FIG. 4 is an explanatory view illustrating an operation of the etching apparatus during a concentration measurement.

Meanwhile, the controller 7 measures the concentration of the processing liquid by the concentration sensor 55 at a predetermined timing. More specifically, as illustrated in FIG. 4, the controller 7 drives the pump 50 so as to circulate the processing liquid in the circulation flow path 49, and drives the heater 52 so as to maintain the processing liquid at a predetermined temperature, as in the liquid processing. In addition, the open/close valve 54 is opened such that a part of the processing liquid flowing in the circulation flow path 49 flows to the concentration measuring flow path 53, and the concentration of the processing liquid is measured by the concentration sensor 55. Meanwhile, after measuring the concentration, the open/close valve 54 is returned to the closed state, and all the processing liquid is circulated in the circulation flow path 49.

Figure 5B:
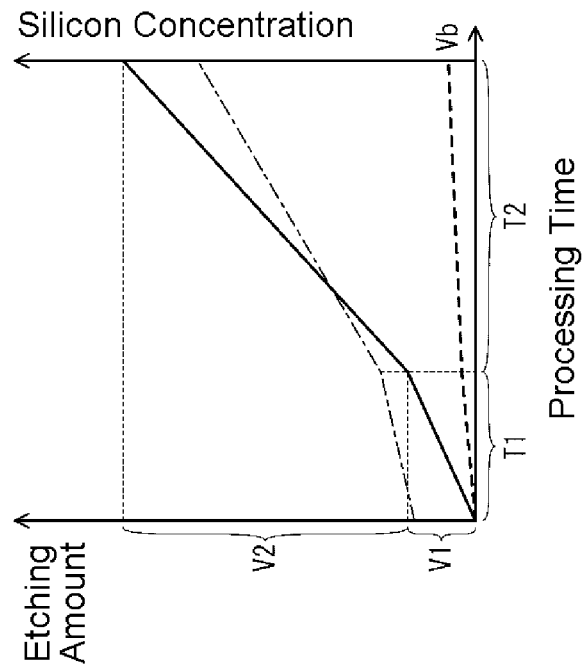
FIGS. 5A and 5B are explanatory views illustrating temporal changes in an etching amount and a silicon concentration during etching.
Figure 5A:
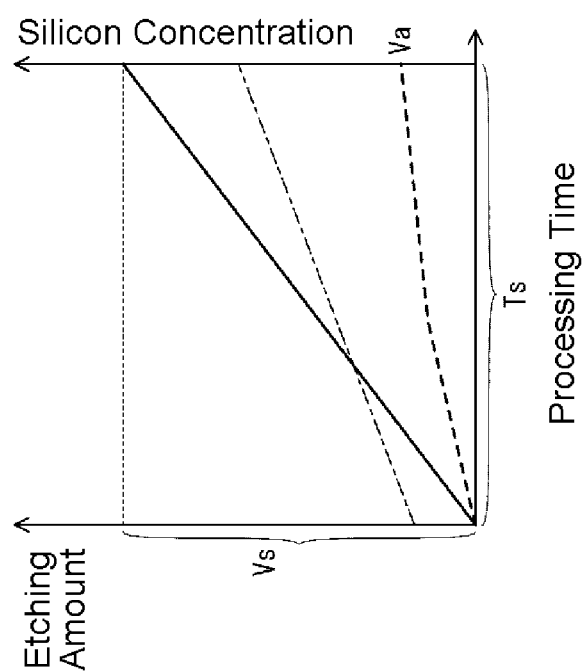

Conventionally, for example, as illustrated in FIG. 5A, a silicon nitride film formed on the surfaces of substrates 8 is etched by an etching amount (indicated by a solid line in the drawing) by immersing the substrates 8 in a phosphoric acid aqueous solution having a temperature ts and concentration Ds for a preset processing time T. In this case, the etching rate Rs of the phosphoric acid aqueous solution for the silicon nitride film becomes (etching amount Vs)/(processing time Ts). The etching rate of the phosphoric acid aqueous solution for the silicon nitride film depends on the temperature or the concentration of the phosphoric acid aqueous solution so that, when the temperature or the concentration is high, the etching rate is improved.

It would be good if only the silicon nitride film is etched by the phosphoric acid aqueous solution during the etching. In practice, however, a part of the silicon oxide film of the underlayer (the etching amount Va) is also etched. The etching rate of the phosphoric acid aqueous solution for the silicon oxide film depends not only on the temperature or the concentration of the phosphoric acid aqueous solution, but also on the silicon concentration in the phosphoric acid aqueous solution. That is, as the silicon concentration decreases, the etching rate of the phosphoric acid aqueous solution for the silicon oxide film increases. In addition, the silicon concentration in the phosphoric acid aqueous solution increases with the lapse of time due to the etching of the silicon nitride film (indicated by a dash-dotted line in the drawing). Therefore, just after initiating the etching, the silicon concentration is low so that the etching rate for the silicon oxide film is high and a lot of the silicon oxide film is etched (indicated by a dotted line in the drawing).

Therefore, in the substrate liquid processing apparatus 1, first, the surfaces of the substrates 8 are subjected to an etching by a phosphoric acid aqueous solution in the state of having a relatively low etching rate for the silicon nitride film is low, and then, the surfaces of the substrates 8 are subjected to the etching with a phosphoric acid aqueous solution in the state of having a relatively high etching rate for the silicon nitride film.

More specifically, as illustrated in FIG. 5B, the controller 7 causes the phosphoric acid aqueous solution to be boiled at a temperature t1 that is lower than that in the conventional case in the etching liquid supply unit 39, thereby generating a phosphoric acid aqueous solution having a temperature t1 and concentration D1 that are lower than the standard temperature ts and concentration Ds of the phosphoric acid aqueous solution. This may generate a phosphoric acid aqueous solution (having the temperature t1 and concentration D1) in the state of having a lower etching rate for the silicon nitride film than that of the standard phosphoric acid aqueous solution (having the temperature ts and concentration Ds). The phosphoric acid aqueous solution is supplied to the liquid processing unit 38 from the etching liquid supply unit 39 so that the etching is performed on the substrates 8 in the liquid processing unit 38. At that time, the etching time is set to a first processing time T1, and the etching amount of the silicon nitride film is set to a first etching amount V1. The etching rate R1 of the phosphoric acid aqueous solution for the silicon nitride film in such a case becomes (first etching amount V1)/(first processing time T1) so that the etching rate R1 is smaller than the standard etching rate Rs.

When the substrates 8 are subjected to the etching for the first processing time T1, the silicon nitride film on the surfaces of the substrates 8 are etched (indicated by a solid line in the drawing), and as a result, the silicon concentration in the phosphoric acid aqueous solution increases (indicated by a dash-dotted line in the drawing). However, in the case where the etching is performed on the substrates 8 with a phosphoric acid aqueous solution in the state of having a relatively low etching rate for the silicon nitride film, the etched amount of the silicon nitride film decreases compared with the case in which the etching is performed with the standard phosphoric acid aqueous solution, and at the same time, the etched amount of the silicon oxide film also decreases (indicated by a dotted line in the drawing). For that reason, the amount of the silicon oxide film to be etched for the first processing time T1 may be suppressed compared with the case in which the etching is performed with the standard phosphoric acid aqueous solution.

Thereafter, the controller 7 causes the phosphoric acid aqueous solution to be boiled at a temperature t2 that is higher than that in the conventional case in the etching liquid supply unit 39, thereby generating a phosphoric acid aqueous solution having a temperature t2 and concentration D2 that are higher than the temperature ts and concentration Ds of the standard phosphoric acid aqueous solution. This may generate a phosphoric acid aqueous solution (having the temperature t2 and concentration D2) in the state of having an etching rate for the silicon nitride film that is higher than that of the standard phosphoric acid aqueous solution (having the temperature ts and concentration Ds). The phosphoric acid aqueous solution is supplied to the liquid processing unit 38 from the etching liquid supply unit 39 so that the etching is performed on the substrates 8 in the liquid processing unit 38. At that time, the etching time is set to a second processing time T2, and the etching amount of the silicon nitride film is set to a second etching amount V2. The etching rate R2 of the phosphoric acid aqueous solution for the silicon nitride film in such a case becomes (second etching amount V2)/(second processing time T2) so that the etching rate R2 is smaller than the standard etching rate Rs.

Since the etching has already been performed on the substrates 8 for the first processing time T1, the silicon concentration in the phosphoric acid aqueous solution increases. For that reason, the silicon nitride film, of which the etching rate does not depend on the silicon concentration, is favorably etched. Meanwhile, the silicon oxide film, of which the etching rate depends on the silicon concentration, is suppressed in terms of the amount to be etched by the phosphoric acid aqueous solution. By this, the etching amount Vb of the silicon oxide film may be set to be smaller than the etching amount Va in the case where the standard phosphoric acid aqueous solution is used.

Meanwhile, in the substrate liquid processing apparatus 1, the sum of the first processing time T1 and the second processing time T2 is set to be the standard processing time Ts, and the sum of the first etching amount V1 and the second etching amount V2 are set to be the standard etching amount Vs. By this, it is possible to suppress the etching amount of the silicon oxide film while ensuring that the processing capacity of substrates 8 by the substrate liquid processing apparatus 1 is equal to that in the conventional one.

In addition, conventionally, seasoning is performed in order to increase the silicon concentration in the phosphoric acid aqueous solution by immersing dummy silicon wafers in the phosphoric acid aqueous solution prior to initiating the etching of the substrates 8 for the purpose of suppressing the etching amount of the silicon oxide film. However, in the substrate liquid processing apparatus 1 (substrate liquid processing method), the seasoning may be omitted since it is possible to suppress the etching amount of the silicon oxide film. By this, it is possible to improve the processing capacity of the substrates 8 by the substrate liquid processing apparatus 1.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
    a liquid processing unit configured to perform a liquid processing on a silicon nitride film formed on a surface of a silicon oxide film which is formed on a surface of a substrate with an etching liquid including a phosphoric acid aqueous solution;
    an etching liquid supply unit configured to supply the etching liquid to the liquid processing unit; and
    a controller programmed to control the etching liquid supply unit,
    wherein the controller is programmed with a non-transitory computer readable medium storing a computer program that when executed causes a computer to perform:
    setting an etching time and an etching amount for etching the substrate with a standard etching liquid having a predetermined standard etching rate for the silicon nitride film as a standard etching time and a standard etching amount, respectively;
    a first supplying the etching liquid having a lower etching rate for the silicon nitride film than the predetermined standard etching rate for the silicon nitride film from the etching liquid supply unit to the liquid processing unit so that the silicon nitride film is etched in the liquid processing unit;
    after the first supplying the etching liquid, a second supplying the etching liquid having a higher etching rate for the silicon nitride film than the predetermined standard etching rate for the silicon nitride film from the etching liquid supply unit to the liquid processing unit so that the silicon nitride film is further etched in the liquid processing unit, thereby allowing an etching amount of the silicon oxide film to be smaller than an etching amount of the silicon oxide film in a case where the standard etching liquid is used to perform the liquid processing on the silicon nitride film;
    setting an etching time and an etching amount for etching the substrate in the liquid processing unit by supplying, from the etching liquid supply unit to the liquid processing unit, the etching liquid having the lower etching rate for the silicon nitride film than the predetermined standard etching rate for the silicon nitride film, as a first processing time and a first etching amount, respectively;
    setting an etching time and an etching amount for etching the substrate in the liquid processing unit by supplying, from the etching liquid supply unit to the liquid processing unit, the etching liquid having the higher etching rate for the silicon nitride film than the predetermined standard etching rate for the silicon nitride film, as a second processing time and a second etching amount, respectively; and
    controlling such that a sum of the first processing time and the second processing time becomes the standard processing time, and a sum of the first etching amount and the second etching amount becomes the standard etching amount.

2. The substrate liquid processing apparatus of claim 1, wherein the controller is further programmed to perform changing an etching rate for the silicon nitride film by changing a temperature or a concentration of the etching liquid supplied to the liquid processing unit from the etching liquid supply unit.

3. The substrate liquid processing apparatus of claim 1, wherein the controller is further programmed to perform:
    the first supplying the etching liquid until a silicon concentration in the etching liquid becomes a concentration at which an amount of the silicon oxide film etched by the etching liquid is suppressed; and
    after the first supplying the etching liquid, the second supplying the etching liquid having the higher etching rate for the silicon nitride film than the predetermined standard etching rate for the silicon nitride film.

4. The substrate liquid processing apparatus of claim 3, wherein the controller is further programmed to perform the etching such that:
    an etching rate of the etching liquid for the silicon oxide film depends on a temperature and a concentration of the etching liquid in addition to the silicon concentration in the etching liquid.

5. The substrate liquid processing apparatus of claim 4, wherein the controller is further programmed to perform the etching such that:
    in the first supplying the etching liquid and the second supplying the etching liquid, as the silicon concentration increases, the etching rate of the etching liquid for the silicon oxide film decreases.

6. The substrate liquid processing apparatus of claim 1, wherein the controller is further programmed to perform:
    in the setting the etching time and the etching amount for etching the substrate with the standard etching liquid, immersing the substrate in the standard etching liquid for the standard etching time.

\* \* \* \* \*